(12) United States Patent
Noguchi

(10) Patent No.: US 7,300,819 B2
(45) Date of Patent: Nov. 27, 2007

(54) SEMICONDUCTOR DEVICE, METHOD FOR MOUNTING THE SAME, AND METHOD FOR REPAIRING THE SAME

(75) Inventor: Takashi Noguchi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 328 days.

(21) Appl. No.: 11/168,549

(22) Filed: Jun. 29, 2005

(65) Prior Publication Data

US 2005/0258526 A1    Nov. 24, 2005

Related U.S. Application Data

(62) Division of application No. 10/259,482, filed on Sep. 30, 2002, now Pat. No. 6,998,705.

(30) Foreign Application Priority Data

May 20, 2002    (JP)    ............... 2002-144526

(51) Int. Cl.
*H01L 21/00* (2006.01)
(52) U.S. Cl. ............... 438/108; 438/613; 257/E21.508; 257/E21.509
(58) Field of Classification Search ................ 438/108, 438/613
See application file for complete search history.

(56) References Cited

U.S. PATENT DOCUMENTS

| | | |
|---|---|---|
| 5,764,485 A | 6/1998 | Lebaschi |
| 6,014,318 A | 1/2000 | Takeda |
| 6,162,997 A | 12/2000 | Memis |
| 6,303,878 B1 | 10/2001 | Kondo et al. |
| 6,359,234 B1 | 3/2002 | Kouda |
| 6,444,924 B1 | 9/2002 | Ishida et al. |
| 6,512,186 B1 | 1/2003 | Nishiwaki et al. |
| 6,512,680 B2 | 1/2003 | Harada et al. |
| 6,538,213 B1 | 3/2003 | Carden et al. |
| 6,639,155 B1 | 10/2003 | Bupp et al. |
| 6,750,404 B1 | 6/2004 | Anslow et al. |
| 6,784,377 B2 | 8/2004 | Chamberlin et al. |
| 2001/0025723 A1 | 10/2001 | Kondo et al. |

FOREIGN PATENT DOCUMENTS

| | | |
|---|---|---|
| JP | 09-045809 | 2/1997 |
| JP | 11-026929 | 1/1999 |
| JP | 2000-349188 | 12/2000 |

*Primary Examiner*—David A. Zarneke
(74) *Attorney, Agent, or Firm*—Rabin & Berdo, PC

(57) ABSTRACT

A method for mounting a semiconductor device, which can decrease the occurrence rate of failures, a method for repairing a semiconductor device, which can easily repair defective solder joints, and a semiconductor device which makes those methods feasible.

A substrate 1 has formed therein through-holes 7 lined on the internal walls with a wiring layer 9, and solder balls 6 are fusion-bonded to the substrate 1 in such a manner as to cover the through-holes 7. In the mounting process or in the repair process, heating probes 41 are passed through the through-holes 7 and thrust into the solder balls 6 to thereby melt the solder balls, and the heating probes are pulled out of the solder balls to let the solder balls cool down. In those processes, only the solder balls 6 can be heated, thereby averting adverse effects on the IC chip 3. In the repair process, the solder balls 6 can be restored to an initial condition free of intermetallic compounds.

16 Claims, 16 Drawing Sheets

Fig.14
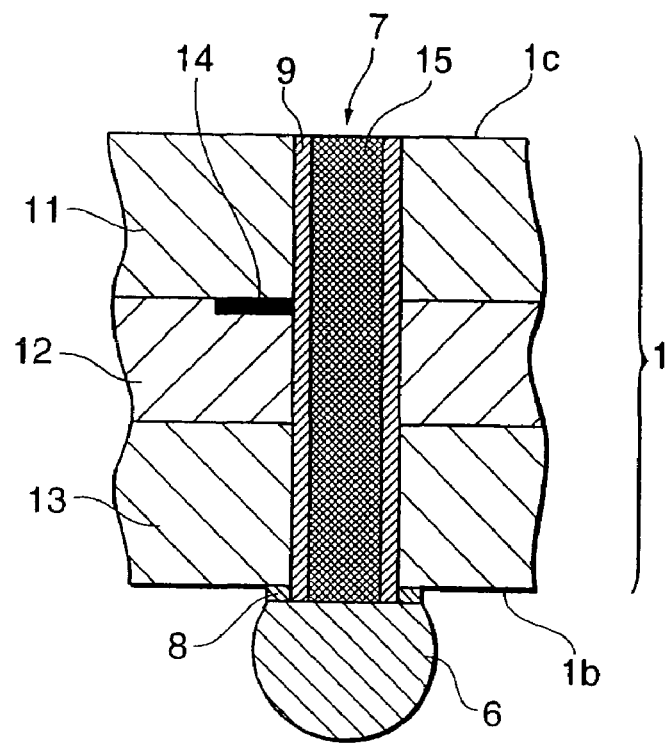
Fig.15(a)      Fig.15(b)
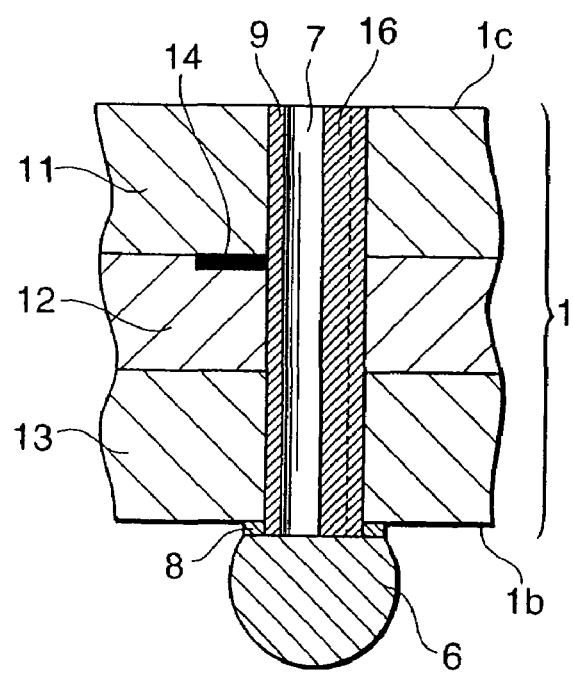 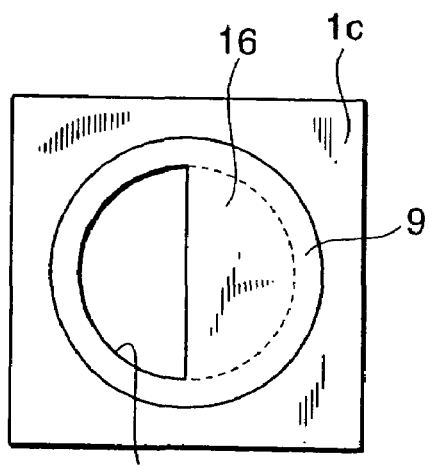

SEMICONDUCTOR DEVICE, METHOD FOR MOUNTING THE SAME, AND METHOD FOR REPAIRING THE SAME

This is a divisional of U.S. application No. 10/259,482, filed Sep. 30, 2002, the subject matter of which is incorporated herein by reference now U.S. Pat. No. 6,998,705.

FIELD OF THE INVENTION

The present invention relates to a semiconductor device of ball grid array package (BGA) structure, a method for mounting the semiconductor device, and a method for repairing the semiconductor device.

PRIOR ART

FIG. 26 is a sectional view schematically showing a conventional semiconductor device of BGA structure of a cavity down type.

As shown in FIG. 26, the conventional semiconductor device comprises a substrate 101 having an electric wiring circuit formed therein, and a heat slug 102 formed by a copper sheet or the like glued by an adhesive to a periphery of a center opening of the substrate 101. The conventional semiconductor device comprises an IC chip glued by an adhesive to the heat slug, a metal thin line 104 electrically connecting the IC chip 103 and wiring on the substrate 101, a sealant 105, such as an epoxy resin, for sealing the IC chip 103 and the metal thin line 104, and solder balls 106 as external terminals arrayed in lattice form on one surface (the lower surface of the substrate 101 in FIG. 26) opposite to the other surface of the substrate where the heat slug 102 is provided. The substrate 101 has multiple insulating substrates stacked up one on top of another. In the example in FIG. 1, the substrate 101 has three insulating substrates 111, 112 and 113. In addition, the substrate 101 includes a wiring layer 114 pinched by the insulating substrate 111, 112 and 113, and conductors 115 for electrically connecting the wiring layer 114 and solder balls 106.

FIG. 27 is an explanatory diagram showing a process of mounting the semiconductor device shown in FIG. 26.

As shown in FIG. 27, in the mounting process of a conventional semiconductor device, solder paste, not shown, composed of minute solder particles and an activator (a flux) is applied to solder balls 106 on the semiconductor device. The solder balls 106 are placed on terminals, not shown, on a mother board 121, which is a printed circuit board. The solder balls 106 are fused to the terminals on the mother board 121 by heating with a heater place 131 from the underside of the mother board 121 and also circulating a hot air 132 between the mother board 121 and the semiconductor device.

Incidentally, in the mounting process of a semiconductor of BGA structure, mounting-induced faults sometimes occur. For example, as shown in FIG. 28, owing to temperature changes after a semiconductor device is mounted (chiefly temperature changes with passage of time that take place at temperatures not higher than 150 centigrade), it sometimes occurs that, at solder joints, a layer of an intermetallic compound 106a (AuSnNi for example) is formed by Sn from the solder balls 106 and Au and Ni from the terminals of the semiconductor device and the terminals of the mother board. Intermetallic compound layers, such as this 106a, tend to increase in thickness with the passage of time. Because the intermetallic compound 106a is a brittle substance, due to a difference in thermal expansion coefficient between the substrate 101 and the mother board 121, stress concentrates at a solder joint, with the result that a crack 135 may occur at the solder joint as shown in FIG. 29(a) or if the crack develops, the solder joint may separate from the terminal 133 as indicated by 136 in FIG. 29(b).

Semiconductor devices rejected in a performance test in the production stage or semiconductor devices in which a failure occurred after shipment from factory are subjected to a repair process. An ordinary repair method is carried out in a manner similar to the mounting process shown in FIG. 27. In other words, after the solder balls 106 are heated, the semiconductor device is detached, the residual solder on the mother board 121 is removed, and a new semiconductor device is mounted.

However, in the mounting process of a conventional semiconductor device, the solder balls 106 are heated by the hot air 132. Therefore, the moisture, absorbed by the substrate 101 and also by the adhesive and the sealant resin 105 at temperature in the process, expands, sometimes giving rise to a blowout called the popcorn phenomenon. If this phenomenon occurs, there is a possibility that the sealant cracks or the chip separates from the sealant.

In the conventional semiconductor-device repair method, the semiconductor device as the repair object is removed from the mother board and is replaced by a new semiconductor device. A problem here is that the detached semiconductor device is not reutilized and goes down the drain is discarded.

SUMMARY OF THE INVENTION

The present invention has been made to solve the above-mentioned problem of the prior art and has as its object to provide a method for mounting a semiconductor device, which can reduce the occurrence rate of semiconductor device failures, such as the popcorn phenomenon mentioned above, and provide a semiconductor device that makes this mounting method viable.

Another object of the present invention is to provide a semiconductor device repair method for easily repairing a failure of the solder joint in a semiconductor device without changing the semiconductor device, and also provide a semiconductor device that makes this repair method feasible.

According to the present invention, there is provided a semiconductor device provided with a semiconductor chip and a substrate, the substrate has a first wiring layer electrically connected to the semiconductor chip and also has a surface with a terminal, comprising:
  a solder ball connected to the terminal;
  a through-hole adjacent to the first wiring layer, the through-hole goes through the substrate and extends to the solder ball through the terminal; and
  a second wiring layer extending from the first wiring layer along an internal wall of the through-hole to the terminal, the second wiring layer electrically connects between the first wiring layer and the terminal.

A heat conductor with heat conductivity, one end of the heat conductor is connected to the solder ball and the other end of the heat conductor is capable of coming into contact with an external heat generating mechanism, may be provided at each through-hole.

The semiconductor device according to the present invention, wherein the through-hole provided to the substrate may be formed so as to extend from a surface other than a surface opposite to the surface having the terminal to the solder ball.

The semiconductor device according to the present invention, wherein the substrate may be a multilayer substrate formed by stacking a plurality of insulating substrates and said first wiring layer.

The semiconductor device according to the present invention, wherein the terminal may have an opening that matches an opening of the through-hole in shape.

The semiconductor device according to the present invention, wherein the terminal may have an opening that makes an opening of the through-hole semi-circular in shape.

The semiconductor device according to the present invention, wherein the terminal may have a plurality of fan-shaped openings, each pair of fan-shaped openings being symmetrical with respect to a point.

The semiconductor device according to the present invention, wherein the terminal may have an opening located at a center of an opening of the through-hole, which is smaller than the opening of the through-hole.

The semiconductor device according to the present invention may further comprises, in the through-hole, a conductor having electrical conductivity, the conductor makes the through-hole semi-cylinder in shape.

The semiconductor device according to the present invention may further comprises, in the through-hole, a filler having elasticity and non-heat-conductivity, the filler fills up the through-hole.

According to the present invention, there is provided a method for mounting a semiconductor device on a printed circuit board, having a semiconductor chip, a substrate having a first wiring layer electrically connected to the semiconductor chip and also having a surface with a terminal, a solder ball connected to the terminal, a through-hole adjacent to the first wiring layer, the through-hole goes through the substrate and extends to the solder ball through the terminal, and a second wiring layer extending from the first wiring layer along an internal wall of the through-hole, the second wiring layer electrically connects between the first wiring layer and the terminal, the method comprising the steps of:

placing the semiconductor device on the printed circuit board through the solder ball;

inserting a hot heating probe into the through-hole from a surface of the substrate opposite to the surface with the terminal and thrusting the solder ball with the probe in order to melt the solder ball; and pulling the probe out from the solder ball in order to solidify the solder ball.

According to the present invention, there is provided a method for repairing a semiconductor device placed on a printed circuit board and to be joined to the board with solder, the semiconductor device has a semiconductor chip, a substrate having a first wiring layer electrically connected to the semiconductor chip and also having a surface with a terminal, a solder ball connected to the terminal, a through-hole adjacent to the first wiring layer, the through-hole goes through the substrate and extends to the solder ball through the terminal, and a second wiring layer extending from the first wiring layer along an internal wall of the through-hole, the second wiring layer electrically connects between the first wiring layer and the terminal, comprising the steps of:

inserting a hot heating probe into the through-hole from a surface of the substrate opposite to the surface with the terminal and thrusting the solder ball with the probe in order to melt the solder ball; and pulling the probe out from the solder ball in order to solidify the solder ball.

BRIEF DESCRIPTION OF THE DRAWINGS

FIG. 9(*b*) is an explanatory diagram showing the state of a solder ball after execution of the repair process according to the first embodiment;

FIG. 14 is a sectional view showing a semiconductor device according to a modification of the first embodiment;

FIG. 15(*a*) is a sectional view schematically showing a through-hole and its vicinity of a semiconductor device according to a second embodiment of the present invention;

FIG. 15(*b*) is a sectional view showing on an enlarged scale the through-hole and its vicinity of the semiconductor device according to the second embodiment of the present invention;

FIG. 16(*b*) is a plan view showing on an enlarge scale the through-hole and its vicinity of the semiconductor device as the modification of the second embodiment;

FIG. 17(*b*) is a plan view showing the terminal of the semiconductor device according to the third embodiment;

DESCRIPTION OF PREFERRED EMBODIMENTS

First Embodiment

The Structure of Semiconductor Device in the First Embodiment

Figure 1:
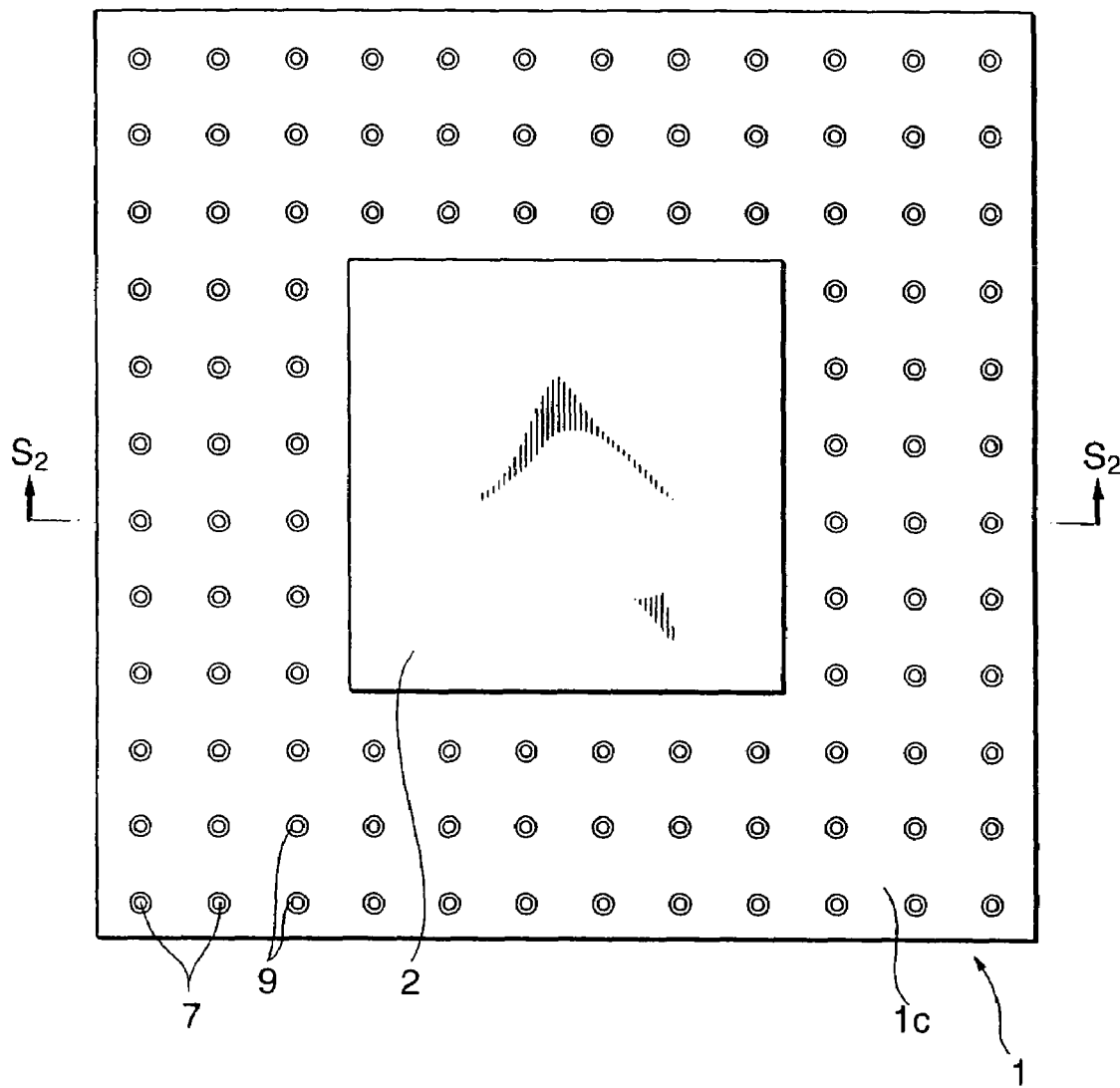
FIG. 1 is a plan view schematically showing the upper surface (with the heat slug 2) of a semiconductor device according to a first embodiment of the present invention.
Figure 2:
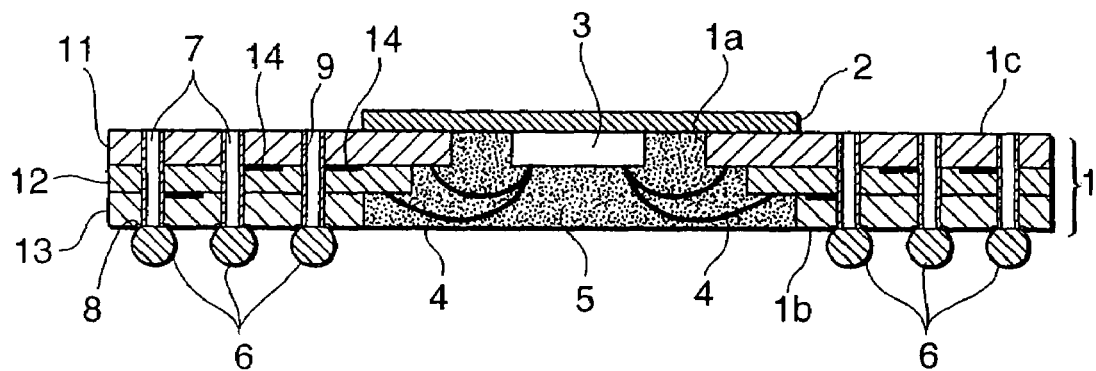
FIG. 2 is a sectional view schematically showing a section S2-S2 of the semiconductor device according to the first embodiment.
Figure 3:
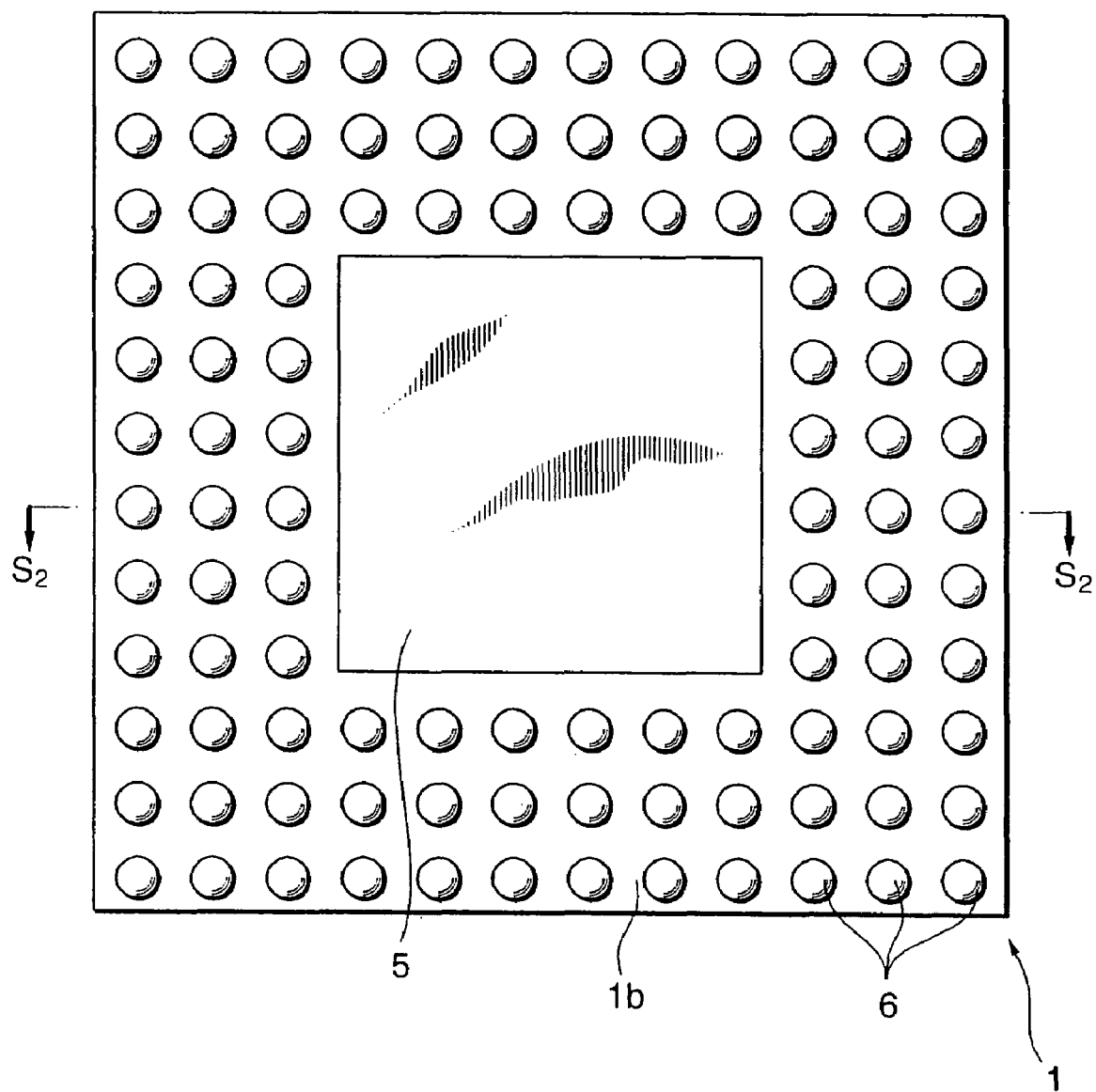
FIG. 3 is a plan view schematically showing a lower surface of the semiconductor device according to the first embodiment.
Figure 4:
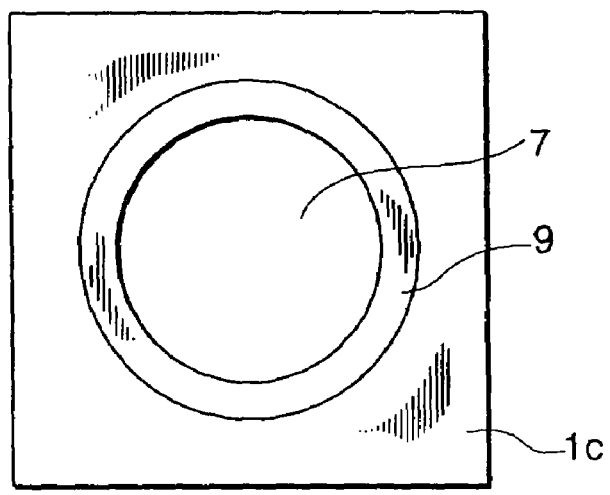
FIG. 4 is a plan view showing on an enlarged scale a through-hole and its vicinity at the upper surface of the semiconductor device according to the first embodiment.
Figure 5:
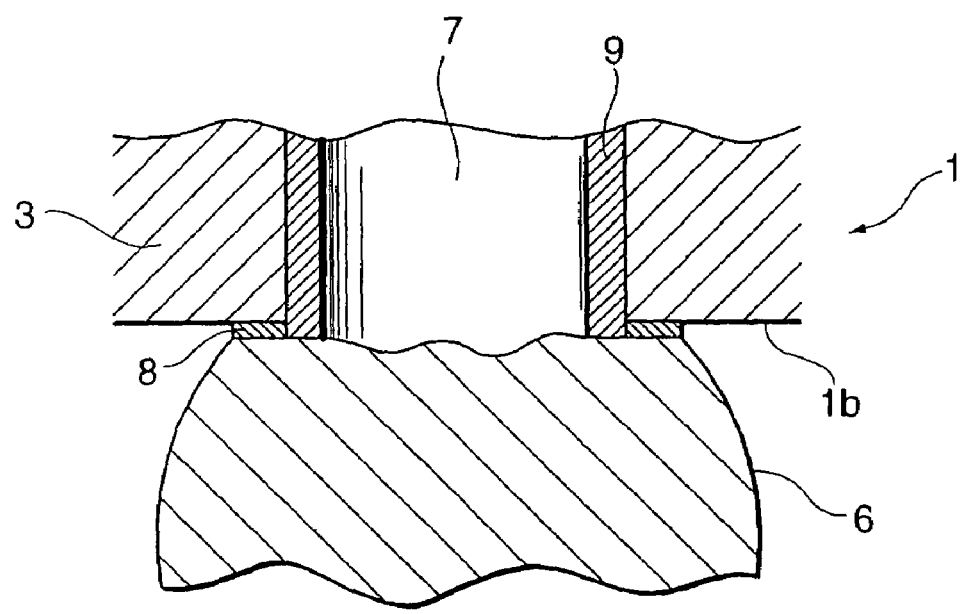
FIG. 5 is a sectional view showing on an enlarged scale the joint between a terminal and a solder ball of the semiconductor device according to the first embodiment.

FIG. 1 is a plan view schematically showing the upper surface (with a heat slug 2) of a semiconductor device according to a first embodiment of the present invention. FIG. 2 is a sectional view schematically showing a plane taken along the S2-S2 line of the semiconductor device in FIG. 1, and FIG. 3 is a plan view schematically showing the lower surface (with solder balls 6) of the semiconductor device in FIG. 1. FIG. 4 is a plan view showing on an enlarged scale a through-hole 7 and its vicinity on the upper surface of the semiconductor device in FIG. 1, and FIG. 5 is a sectional view showing on an enlarged scale a joint between a terminal 8 and a solder ball 6 of the semiconductor device in FIG. 1.

As shown in FIGS. 1 to 3, the semiconductor device according to the first embodiment has a substrate 1, in which electric circuits have been formed. In the example illustrated, the substrate 1 includes three insulating substrates 11, 12 and 13 stacked one on top of another and a wiring layer 14 as a first wiring layer, pinched by the insulating substrates 11, 12 and 13. The number of the insulating substrates is not limited to three and its sectional profile of the insulating substrates is not limited to rectangular.

As shown in FIG. 2, the semiconductor device according to the first embodiment includes a heat slug 2 of copper, for example, glued by an adhesive to the periphery of a center opening 1a in the upper surface 1c (top surface in FIG. 2) of the substrate 1, an IC chip 3 glued by an adhesive to the heat slug 2, metal thin lines 4 electrically connecting the IC chip to the wires of the substrate 1 (in other words, bonding wires), a sealant 5 of epoxy resin, for example, for sealing the IC chip 3 and the metal thin lines 4, and a plurality of solder balls 6 as external terminals arranged in lattice form on the lower surface (bottom surface in FIG. 2) of the substrate 1 opposite to the upper surface 1c. The semiconductor device according to the first embodiment has a cavity-down type structure with improved heat radiation properties, but may have another structure, such as a cavity-up type. The solder balls are not limited to the array and the number as shown in FIG. 3.

As shown in FIG. 2, the semiconductor device according to the first embodiment has through-holes 7 formed in the substrate 1 so as to go through the upper surface 1c and the lower surface 1b, and wiring layers 9 as second wiring layers, shown in FIG. 4, which go along the internal walls of the through-holes to connect to terminals 8 at the lower surface 1b. The through-holes 7 may be formed by punching or reaming with a drill. Each terminal 8 has a structure having a Cu layer, a Ni layer and an Au layer stacked in this order as viewed from the substrate 1, and has an opening matching in shape with the opening of the through-hole 7. The wiring 9 is a Cu wiring layer formed by a plating process, for example. As shown in FIG. 5, the solder balls 6 are fused to the terminals 8, and are attached to the lower surface 1b of the substrate 1, thus covering the through-holes 7. The fusion of the solder ball 6 to the terminal 8 is carried out by the following sequence: an activated flux is applied to the terminal 8, and on top of that, the solder ball 8 is placed, and heat is applied.

In FIG. 2, the through-holes 7 extend perpendicularly to the surface of the substrate 1, but those holes 7 may be tilted with respect to the surface of the substrate 1. The through-holes 7 may be provided in any direction or shape so long as heating probes 41 of heating devices 40, which will be described later, can pass through the through-holes 7 and contact the solder balls 6.

Repair Method of Semiconductor Device in the First Embodiment

Figure 6:
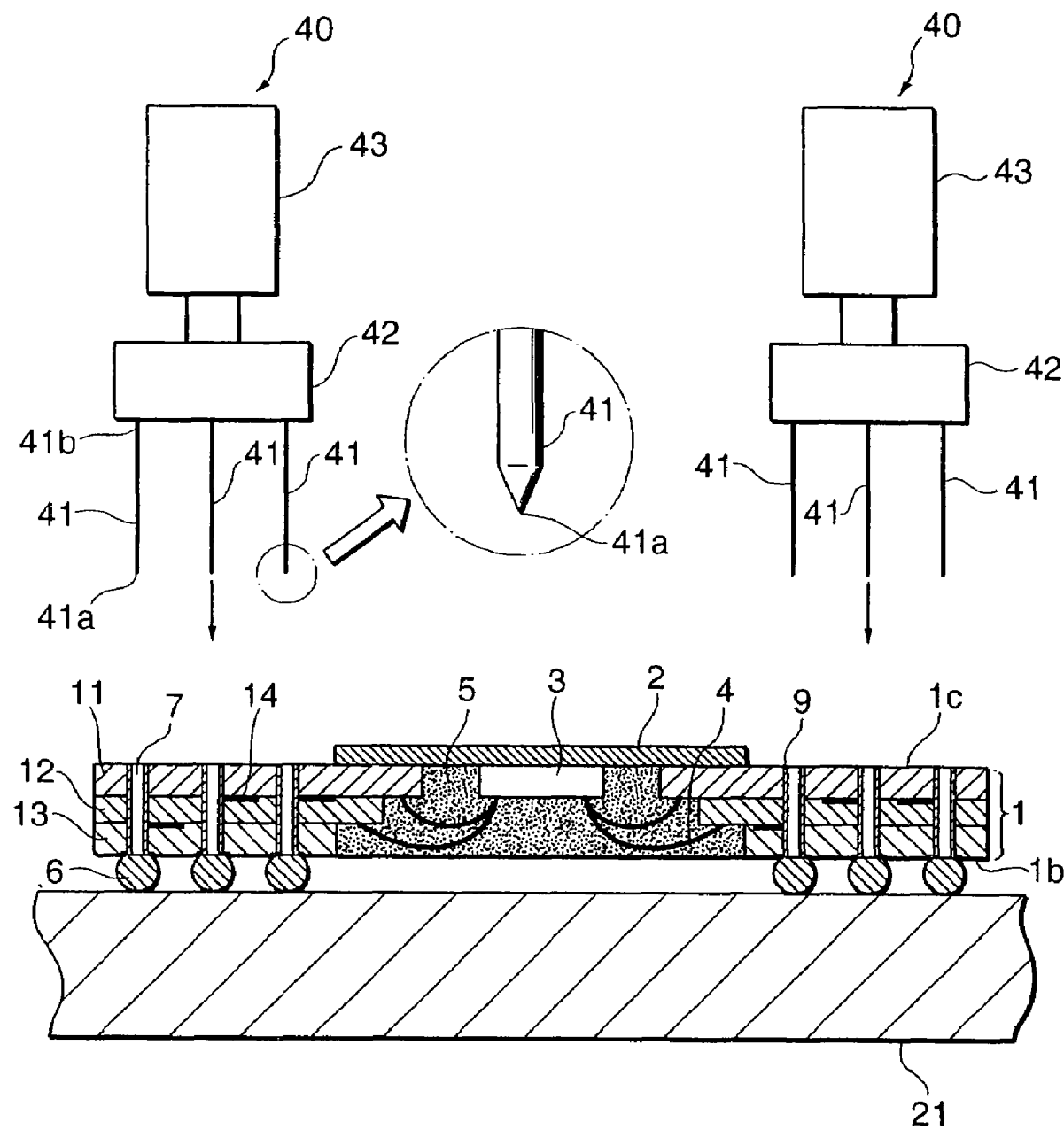
FIG. 6 is an explanatory diagram of a repair process (step 1) of the semiconductor device according to the first embodiment mounted on the mother board.
Figure 7:
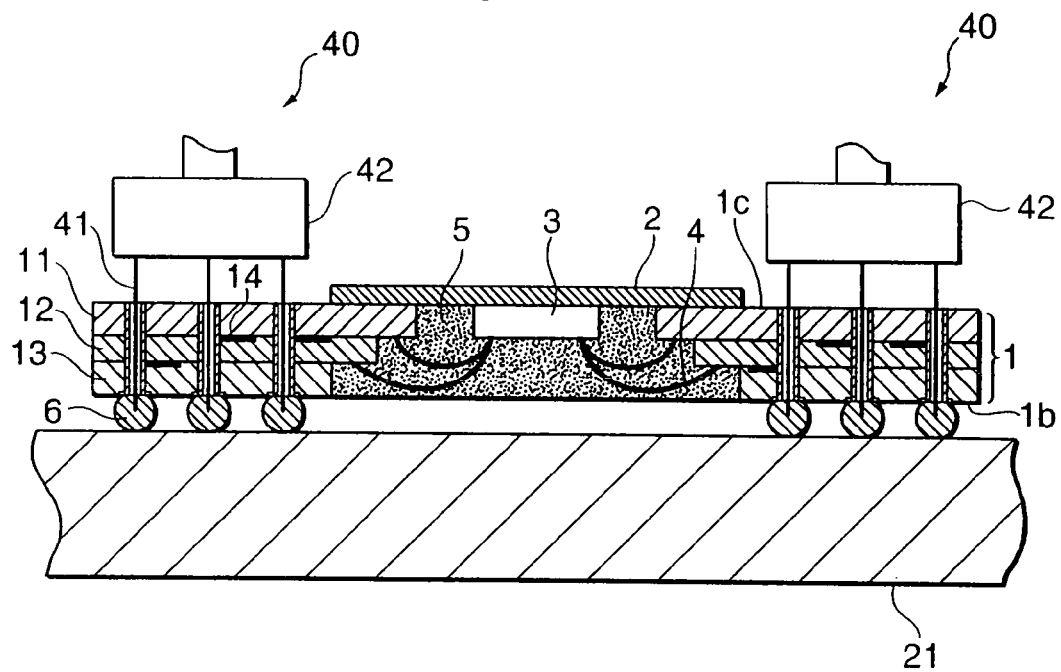
FIG. 7 is an explanatory diagram of the repair process (step 2) of the semiconductor device according to the first embodiment mounted on the mother board.
Figure 8:
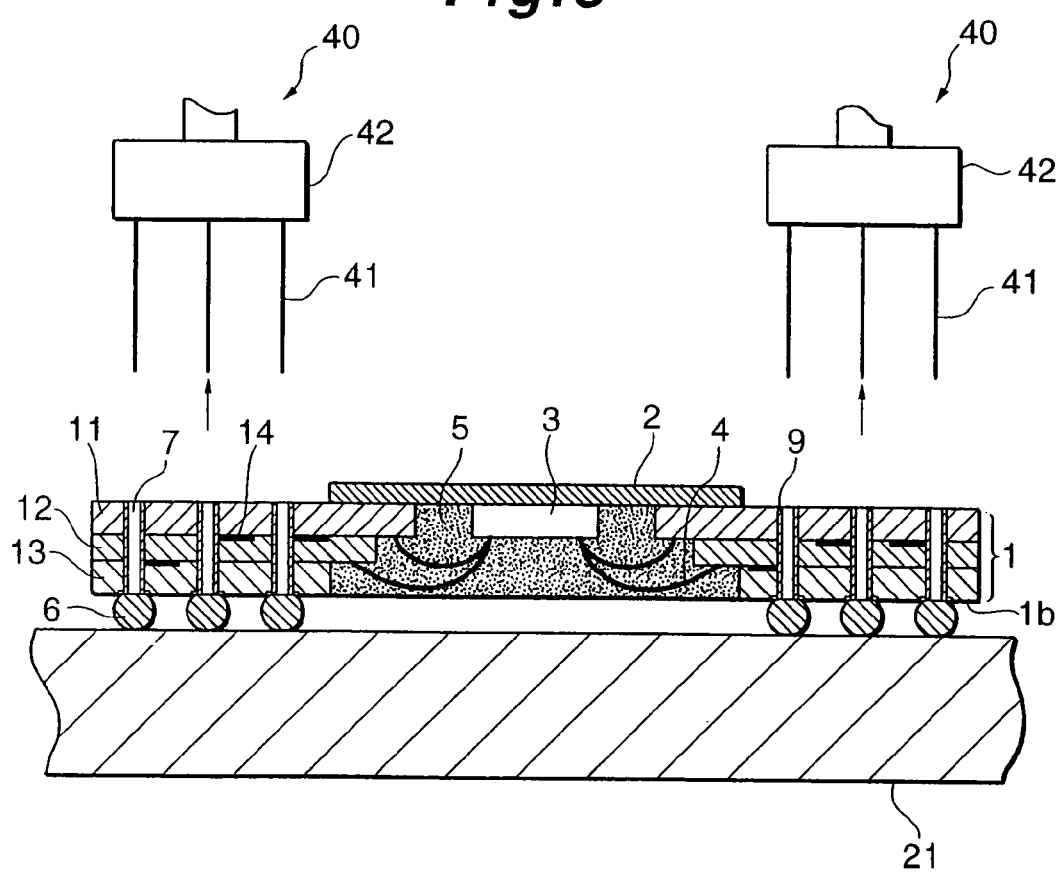
FIG. 8 is an explanatory diagram of the repair process (step 3) of the semiconductor device according to the first embodiment mounted on the mother board.
Figure 9A:
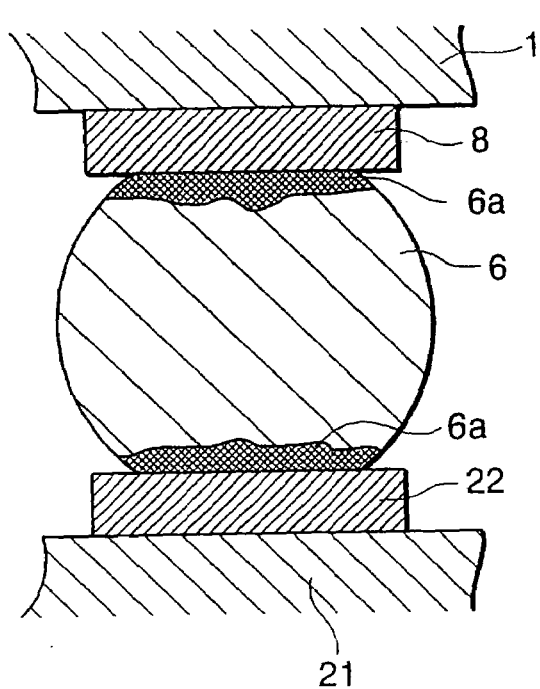
FIG. 9(*a*) is an explanatory diagram showing the state of a solder ball before execution of the repair process according to the first embodiment.
Figure 9B:
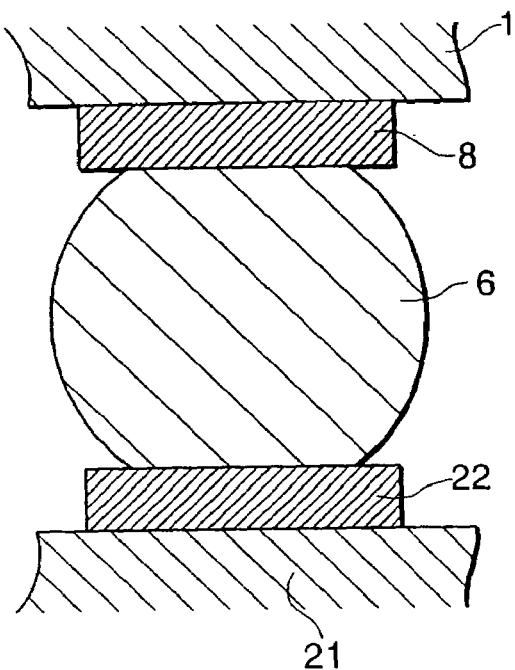

FIGS. 6, 7 and 8 are explanatory diagrams for explaining the repair process (step 1-3) according to the first embodiment of the semiconductor device mounted on the mother board 21, which is a printed circuit board. FIGS. 9(a) and 9(b) are explanatory diagrams respectively showing the states of the solder ball 6 before and after the execution of the repair process.

The semiconductor device, to which the repair method according to the first embodiment is applied, is a semiconductor device which has the solder balls 6 of the semiconductor device attached and fused to the terminals 22 (FIG. 9) of the mother board 21 as shown in FIG. 6. Semiconductor devices which are to be repaired are those which were rejected in a performance test at the production stage, and those which turned out to be defective after they were shipped.

In the repair method according to the first embodiment, heating devices 40 are used to heat the solder balls 6 as shown in FIG. 6. The heating device 40 includes a heat generator 42 that holds proximal ends 41b of heating probes 41, and a moving mechanism 43 for moving the heat generator 42 in horizontal and vertical directions. The heating probe 41 is preferably formed by a material of better thermal conductivity. Materials suitable for the heating probes 41 are metals, such as copper, silver, and platinum, or copper alloys, such as Zr—Cu, Fe—Cu, and Ni—Cu, or iron alloys, such as a 42-alloy (42% Ni—Fe). In the example shown in FIG. 6, the distal ends 41a of the heating probes 41 are saliently pointed, but may be formed with a spherical head or a flat head.

Description will be made of a repair method according to the first embodiment. The heating probes 41 of the heating devices shown in FIG. 6 are heated. The heating temperature may be set at a predetermined temperature within a range of about 180 to 350 centigrade according to the composition, for example, of the solder balls 6, but preferably about 240 centigrade. The heating probes 41, after set at a predetermined temperature, lowered from above the through-holes 7 of the semiconductor device, inserted into the through-holes 7, thrust into the solder balls 6 as shown in FIG. 7, and the solder balls 6 are thereby melted.

After this, as shown in FIG. 8, the heating probes 41 of the heating devices 40 are pulled out of the solder balls 6 and the solder balls are made to solidify.

By the repair method described above, the intermetallic compound layers 6a of the solder ball 6, as shown in FIG. 9(a), are eliminated as is clearly shown in FIG. 9(b). Accordingly, defective solder joints between the solder balls 6 and the terminals 8 or 22 are eradicated which result from the presence of brittle intermetallic compound layers 6a.

Note that if the amount of solder in the solder balls 6 is decreased by actions of thrusting or extracting the heating probes 41, granular or molten solder may be added from the through-holes 7 of the upper surface 1c before the heating probes 41 are inserted.

According to the repair method of the first embodiment, the failures at the joints of the solder balls 6 of the semiconductor device can be repaired easily and semiconductor devices having such failures need not be changed. Another advantage is that only the solder balls 6 are heated by the heating probes 41, with the result that the other component parts of the semiconductor device, the IC chip, above all else, are not adversely affected by high temperature during heating.

Mounting Method of Semiconductor Device in First Embodiment

Figure 10:
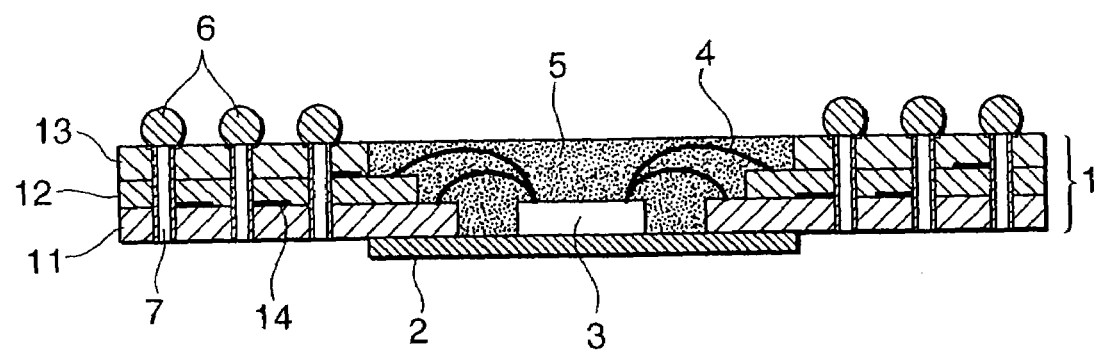
FIG. 10 is a sectional view schematically showing a semiconductor device to which the mounting method of the first embodiment is applied.

FIG. 10 is a sectional diagram schematically showing the semiconductor device to which the mounting method according to the first embodiment is applied.

Semiconductor devices, for which the mounting method according to the first embodiment is applicable, are those, in which flux was applied to the terminals 8 on the substrate 1, on top of that, the solder balls 6 were placed, and when they were passed through a heating furnace, not shown, the solder balls 6 were partially melted at the surface and were thereby fusion-bonded to the terminals 8.

Figure 11:
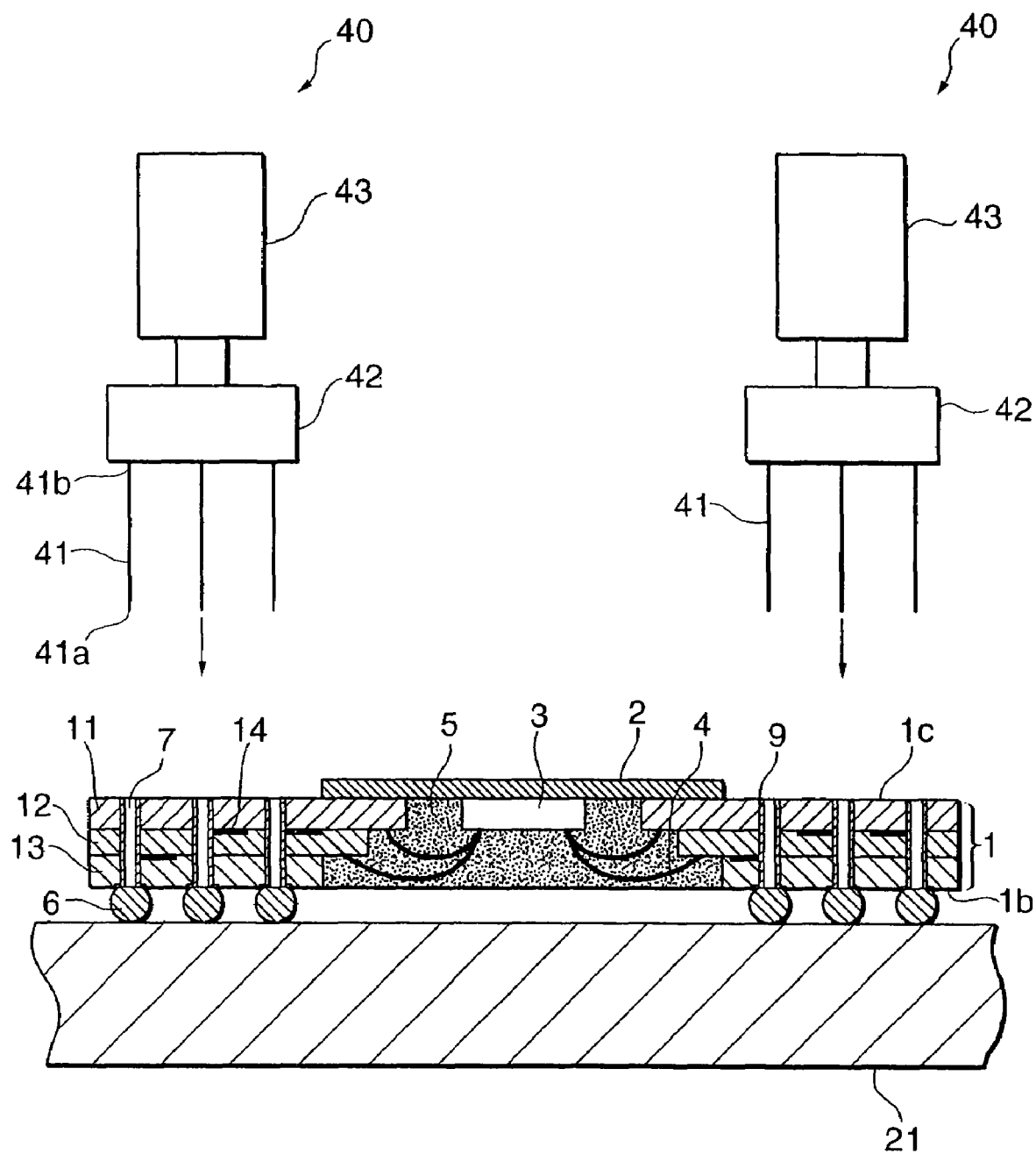
FIG. 11 is an explanatory diagram of a process (part 1) of mounting a semiconductor device according to the first embodiment on the mother board.
Figure 12:
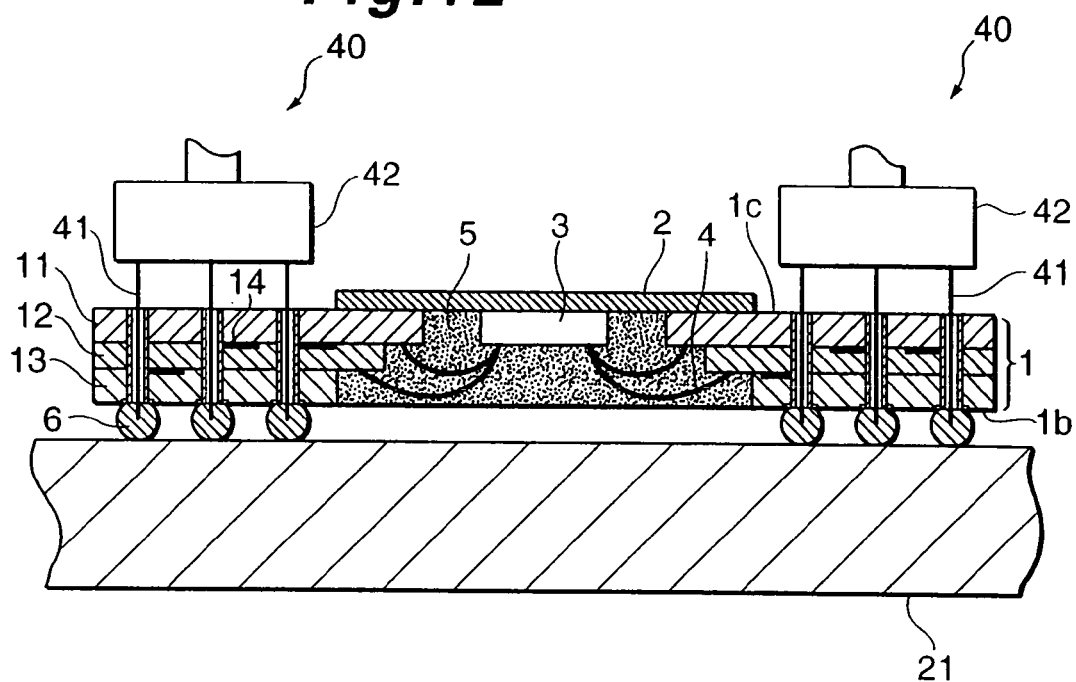
FIG. 12 is an explanatory diagram of the process (step 2) of mounting the semiconductor device according to the first embodiment on the mother board.
Figure 13:
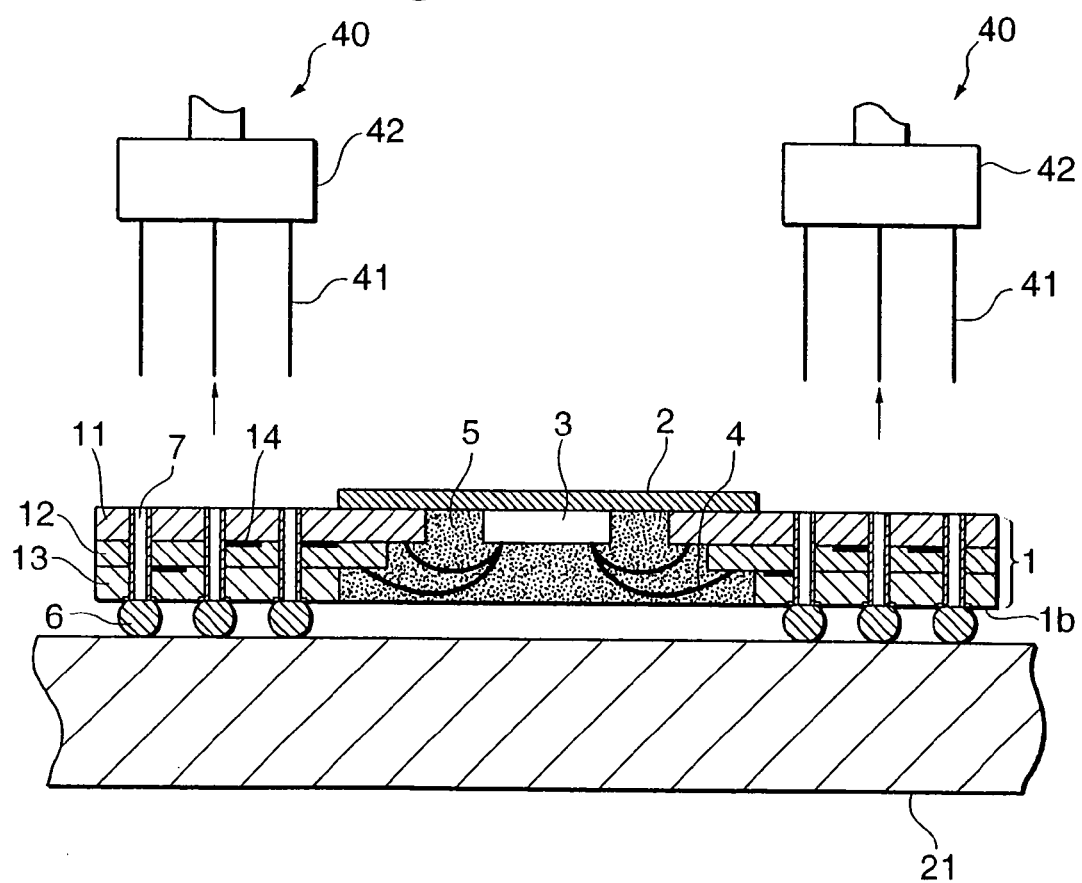
FIG. 13 is an explanatory diagram of the process (step 3) of mounting the semiconductor device according to the first embodiment on the mother board.

FIGS. 11, 12 and 13 are explanatory diagrams of the process (steps 1~3) for mounting the semiconductor device to the mother board 21.

In the method for mounting a semiconductor device according to the first embodiment, the same heating devices 40 as are used in the above-mentioned repair method are used. The mounting method of the first embodiment is as follows. As shown in FIG. 11, flux, not shown, is applied to the solder balls 6 of the semiconductor device and the semiconductor balls 6 are placed on the mother board 21. Then, the heating probes 41 of the heating devices 40 are heated to a predetermined temperature similar to that in the repair method, and lowered from above the through-holes 7 of the semiconductor device, inserted into the through-holes 7, and as shown in FIG. 12, and thrust into the solder balls 6, which are thereby melted. After this, as shown in FIG. 13, the heating probes 41 of the heating devices 40 are pulled out of the solder balls 6, and the solder balls 6 are made to solidify.

By this process, the solder balls 6 are soldered to the terminals of the mother board 21.

If the amount of solder is decreased by actions of thrusting and extracting the heating probes 41, granular or molten solder may be added from the upper side of the through-holes 7 before the heating probes 41 are inserted.

According to the mounting method of the first embodiment, only the solder balls 6 are heated by the heating probes 41, the other component parts (particularly, the IC chip 3) are not negatively-affected during heating. Therefore, the failure occurrence rate of semiconductor devices can be reduced.

Modification of First Embodiment

FIG. 14 is a sectional view showing a modification of the first embodiment. In this semiconductor device, each through-hole 7 is filled with a filling material 15. For the filling material 15, it is possible to use materials which have elasticity and non-heat-conductivity, like gel resins which do not exhibit fluidity after the through-hole 7 is filled, such as a silicon-based resin "JCR6110" by Toray Industries, Inc. or a polyimide-based resin "PIX8200" by Hitachi Chemical Co., Ltd. The filled portion 15 is formed by injecting a gel resin from the upper side of the openings of the through-holes 7. As shown in FIG. 14, by the provision of the filled portion 15 in the through-hole 7, it is possible to prevent failures ascribable to corrosion, for example, of the joint between the terminal 8 and the solder ball 6, and also preclude the occurrence of failures resulting from the infiltration of foreign matter into the through-holes 7 from outside.

By the way, in the repair process of the semiconductor device shown in FIG. 14, the heating probe 41 is thrust into the filled portion 15, and further thrust into the solder ball 6, and subsequently the heating probe is pulled out. If the gel resin is decreased during the repair process, a gel resin can be replenished as one thinks fit from the opening of the through-hole 7.

Second Embodiment

FIG. 15(a) is a sectional view schematically showing the through-hole and its vicinity of the semiconductor device according to a second embodiment of the present invention. FIG. 15(b) is a plan view showing the through-hole and the vicinity on an enlarged scale.

The difference from the semiconductor device according to the first embodiment is that an electrode 16 as an electrical conductor is formed in the shape of a semi-circular column within the through-hole 7 in the semiconductor device of the second embodiment. For forming the conductor made by an electrode material 16, it is possible to adopt a method of manufacturing a semicircular column part, setting this column part in each through-hole of the substrate 1, and forming an electrode 16 that fills up the clearance between the column part and the through-hole 7, and then extracting the semi-circular electrode 16. According to the semiconductor device of the second embodiment, the electrode 16 is additionally connected to the solder ball 6, the bond area with the solder joint 6 is increased, and therefore the bond strength of the solder ball 6 is improved.

The repair method and the mounting method of the semiconductor device according to the second embodiment are the same as those in the first embodiment.

Figure 16A:
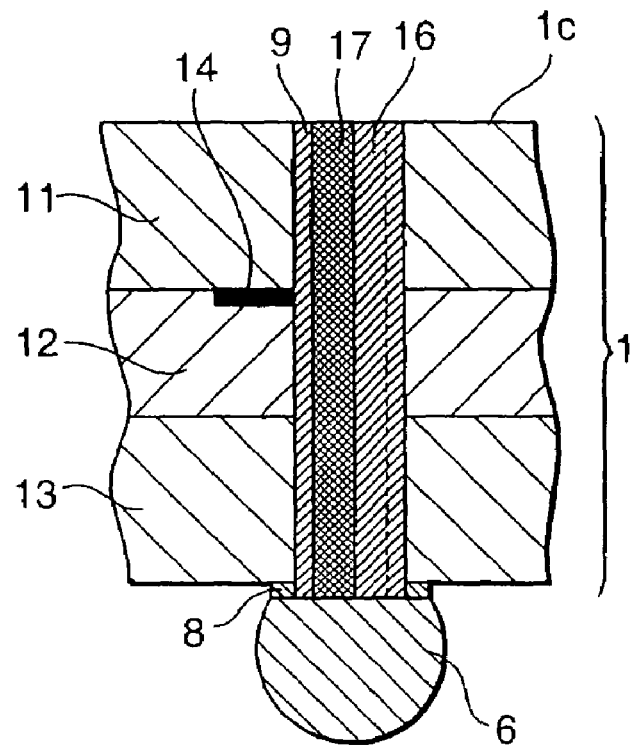
FIG. 16(*a*) is a sectional view schematically showing a through-hole and its vicinity of a semiconductor device as a modification of the second embodiment.
Figure 16B:
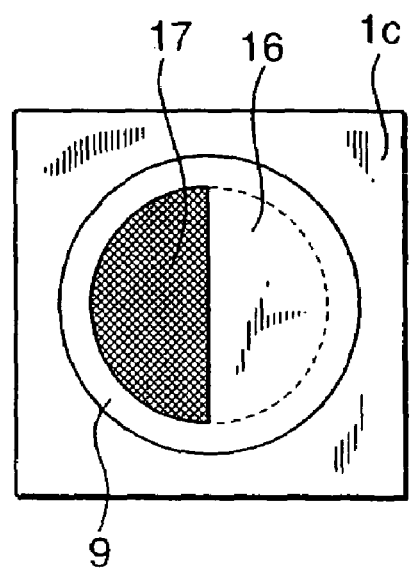

FIG. 16(a) is a sectional view schematically showing a through-hole and its vicinity of a semiconductor device as a second embodiment of the present invention, and FIG. 16(b) is a plan view showing on an enlarged scale the through-hole and its vicinity of the semiconductor as the second embodiment of the present invention.

The only difference from the semiconductor device shown in FIG. 15 is that a filler 17 of a gel resin is provided that fills up the through-hole 7 of semi-cylindrical structure as shown in FIG. 16. Note that the material and the role of the filler 17 are the same as those of the filler in the first embodiment.

Third Embodiment

Figure 17A:
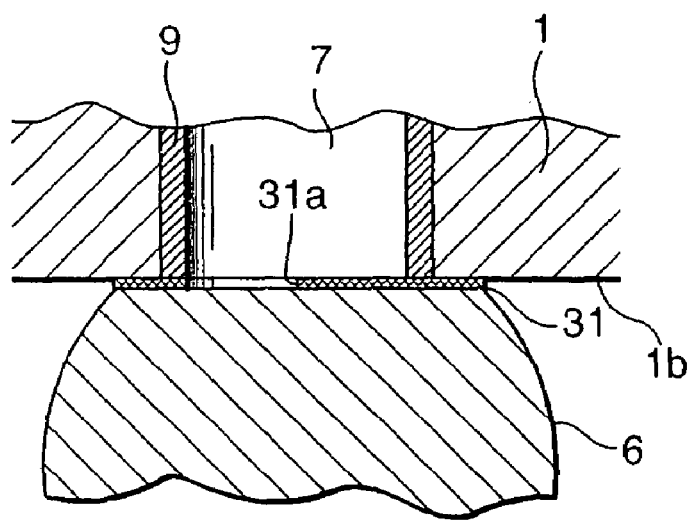
FIG. 17(*a*) is a sectional view schematically showing a through-hole and its vicinity of a semiconductor device according to a third embodiment of the present invention.
Figure 17B:
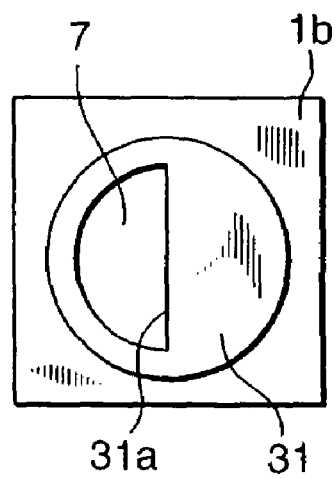

FIG. 17(a) is a sectional view schematically showing a through-hole and its vicinity of a semiconductor device according to a third embodiment of the present invention, and FIG. 17(b) is a plan view showing the terminal 31 of the substrate 1.

The only difference from the semiconductor device of the first embodiment is that a semi-cylindrical opening 31a is provided in the terminal 31 as shown in FIG. 17(b) in the semiconductor device in the third embodiment. According to the semiconductor device of the third embodiment, the bond area between the solder ball 6 and the terminal 31 is increased and the bond strength of the solder ball is increased.

The repair method and the mounting method of the semiconductor device according to the third embodiment are the same as those in the first embodiment.

A filler of gel resin may be provided that fills up the through-hole of the semiconductor device according to the third embodiment.

Figure 18A:
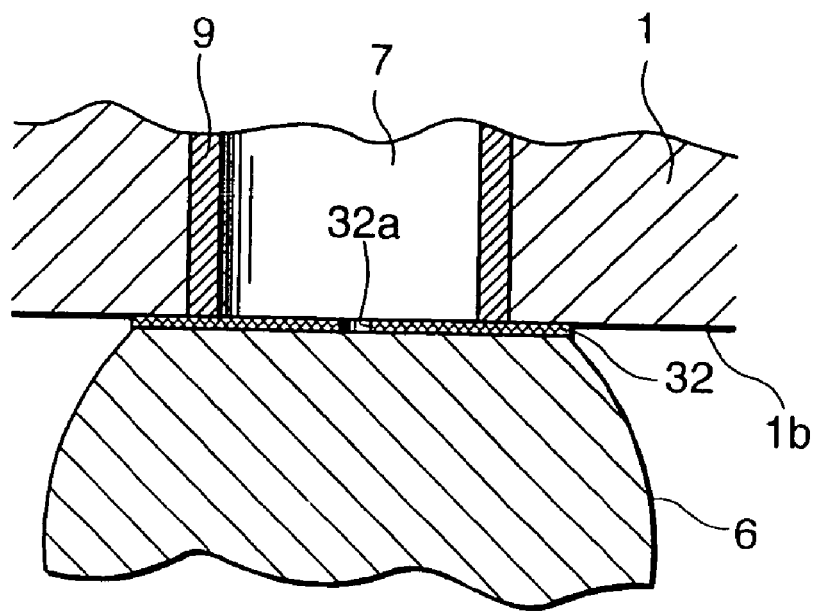
FIG. 18(*a*) is a sectional view schematically showing a through-hole and its vicinity of a semiconductor device according to a fourth embodiment of the present invention.
FIG. 18(b) is a plan view showing the terminal of the semiconductor device according to the fourth embodiment.
Figure 18B:
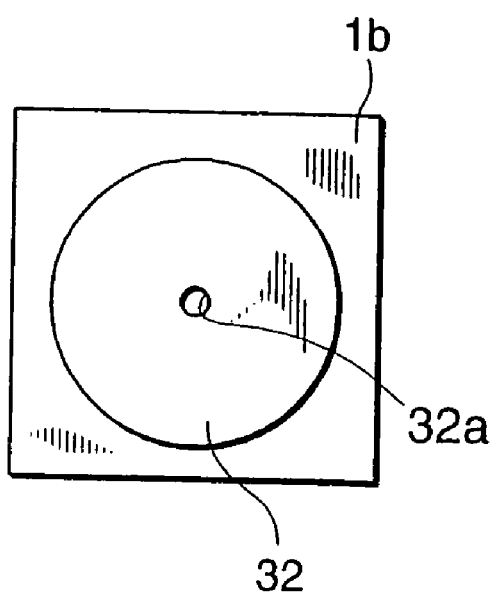

FIG. 18(a) is a sectional view schematically showing a through-hole and its vicinity of a semiconductor device according to a fourth embodiment of the present invention, and FIG. 18(b) is a plan view showing the terminal 32 of the substrate 1.

The difference of the fourth embodiment from the first embodiment is that an opening 32a is provided at the terminal 32, which is located at the center of the through-hole 7 and which has a smaller diameter than the inside diameter of the through-hole. According to the semiconductor device of the fourth embodiment, the bond area between the solder ball 6 and the terminal 32 can be increased and the bond strength of the solder ball 6 can be increased. Moreover, when the heating probe 41 is thrust into the solder ball 6, the heating probe 41 is guided by the opening 32a of the terminal 32 to about the center of the solder ball 6, and therefore the solder ball 6 can be heated uniformly, thereby ensuring a good bonded state of the solder joint after the mounting or repair process. Furthermore, the opening 32a of the terminal 32 may be tapered such that the diameter becomes gradually smaller along the path of the opening from the through-hole 7 to the solder ball 6, by which the positioning of the heating probe 41 with respect to the solder ball 6 can be made easier.

The repair method and the mounting method of the semiconductor device according to the fourth embodiment are the same as those in the first embodiment.

A filler of gel resin may be provided that fills up the through-hole 7 of the semiconductor device of the fourth embodiment.

Fifth Embodiment

Figure 19A:
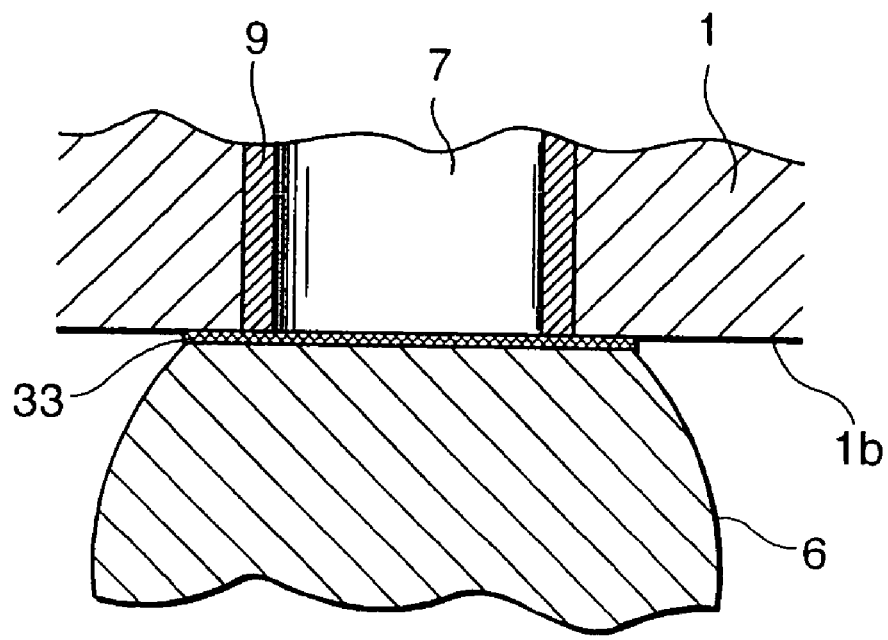
FIG. 19(a) is a sectional view schematically showing a through-hole and its vicinity of a semiconductor device according to a fifth embodiment of the present invention.
Figure 19B:
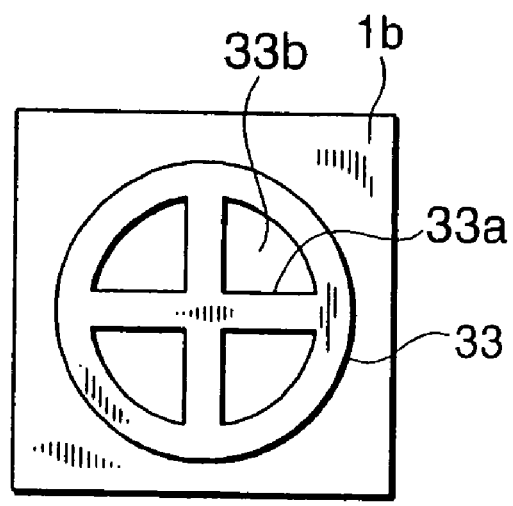
FIG. 19(b) is a plan view showing the terminal of the semiconductor device according to the fifth embodiment.

FIG. 19(a) is a sectional view schematically showing a through-hole and its vicinity of a semiconductor device according to a fifth embodiment of the present invention, and FIG. 19(b) is a plan view showing the terminal 33 of the substrate.

In the semiconductor device of a fifth embodiment, its difference from the semiconductor device of the first embodiment is that the terminal 33 has a cruciform portion 33a as shown in FIG. 19(b), for which reason the terminal 33 has four fan-shaped openings 33b. According to the semiconductor device according to the fifth embodiment, the bond area between the solder ball 6 and the terminal 33 is increased, and the higher bond strength of the solder ball 6 can be secured. Further, each pair of the bond areas between the terminal 33 and the solder ball 6 is symmetrical with respect to a point, so the bond strength of the joint is made higher and stable.

The repair method and the mounting method of the semiconductor device according to the fifth embodiment are the same as those in the first embodiment. The heating probe 41 is passed through the opening 33b and thrust into the solder ball 6.

In the through-hole 7 of the semiconductor device of the fifth embodiment, a filler of gel resin may be provided to fill up the through-hole.

Sixth Embodiment

Figure 20:
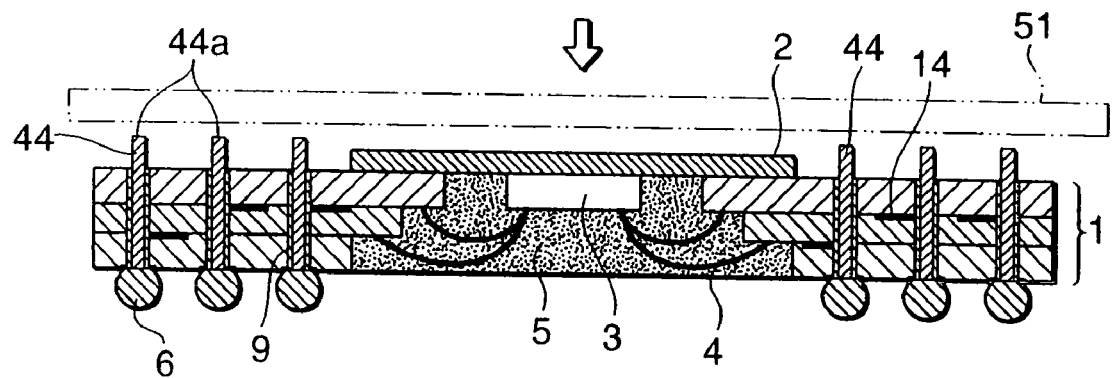
FIG. 20 is a sectional view schematically showing a semiconductor device according to sixth embodiment of the present invention.

FIG. 20 is a sectional view schematically showing a semiconductor device according to a sixth embodiment of the present invention.

The only difference of the sixth embodiment from the semiconductor device of the first embodiment is that fixed probes 44 of heat-conducting material are provided so as to protrude above the upper surface 1c in order that one end of each fixed probe 44 is in contact with the solder ball 6 and the other end is capable of contacting a heat generating part 51 of an external heating unit. The fixed probes 44 are previously inserted into the through-holes 7, and can be ground to have the same height. The fixed probes 44 are preferably formed by a material with good heat conductivity. Suitable materials for this purpose are metals, such as copper, silver and platinum, copper alloys, such as Zr—Cu, Fe—Cu and Ni—Cu, or iron alloys, including 42-alloy (42% Ni—Fe).

The repair method and the mounting method of the semiconductor device according to the sixth embodiment are as follows. The heating part 51 (a panel type for example) of an external heating unit is heated and brought into contact with end portions 44a of the fixed probes 44 to heat the solder balls 6. In this heating, the heat generating part 51 may first be brought into contact with the solder balls 6 and then heated. After the solder balls 6 are made molten by the heating described above, the heat generating part 51 of the heating unit is detached from the end portions 44a of the fixed probes 44 (or, heat-generation is stopped) to cool the solder balls 6.

According to the sixth embodiment, the solder balls 6 can be heated uniformly. In the mounting process, flux, not shown, is applied to the solder balls 6 of the semiconductor device, and those solder balls 6 are put on the terminals on the mother board 21, and then the fixed probes 44 are heated by the heat generating part 51 of the heating unit.

In other respects except for what was described above, the sixth embodiment is the same as the first embodiment.

A filler of gel resin may be provided to fill up the gap between the wiring layer and the fixed probe 44 in each through-hole of the semiconductor device of FIG. 20.

Figure 21:
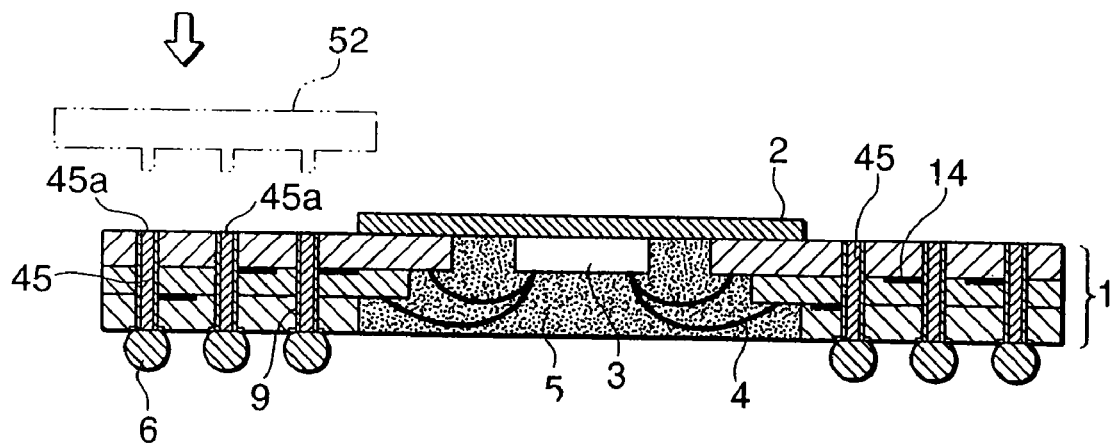
FIG. 21 is a sectional view schematically showing a modification of the sixth embodiment.

FIG. 21 is a sectional view schematically showing a modification of the semiconductor device of the sixth embodiment of the present invention.

The semiconductor device as a modification shown in FIG. 21 differs from the semiconductor device as the sixth embodiment shown in FIG. 20 in that the end faces 45*a* of the fixed probes 45 are flush with the surface 1*c* of the substrate. In this modification, protrusions, which can contact the end faces 45*a* of the fixed probes 45, are provided on the heat generating part 52 of the heating unit.

Figure 22:
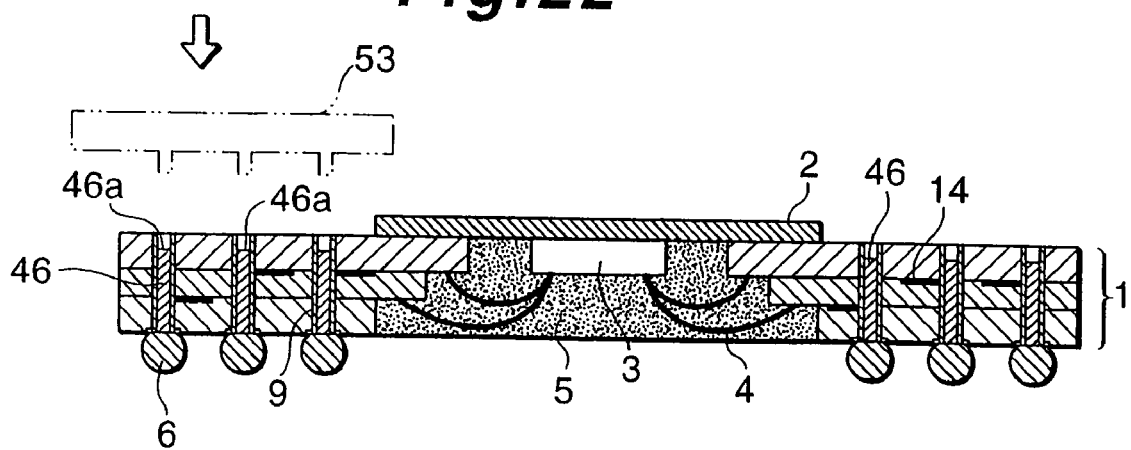
FIG. 22 is a sectional view schematically showing another modification of the sixth embodiment.

FIG. 22 is a sectional view schematically showing another modification of the semiconductor device of the sixth embodiment of the present invention.

The semiconductor device as a modification shown in FIG. 22 differs from the semiconductor device as the sixth embodiment shown in FIG. 20 in that the end faces 46*a* of fixed probes 46 are lower than the surface 1*c* of the substrate 1. In this modification, protrusions, which can contact the end faces 46*a* of the fixed probes 46, are provided on the heat generating part 53 of the heating unit.

Seventh Embodiment

Figure 23:
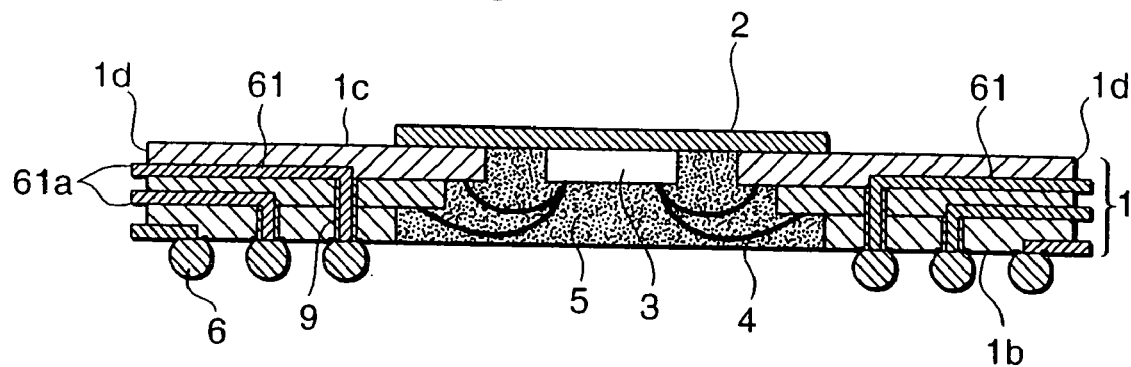
FIG. 23 is a sectional view schematically showing a semiconductor device according to a seventh embodiment of the present invention.

FIG. 23 is a sectional view schematically showing the semiconductor device according to a seventh embodiment of the present invention.

The differences of the semiconductor device of the seventh embodiment from the semiconductor device of the first embodiment are that as shown in FIG. 23, through-holes 60 are formed in the substrate 1 so as to run from the lower surface 1*b* to the side face 1*d* of the substrate 1, and that fixed probes 61 of heat conducting material are provided in the through-holes 60, the fixed probes being joined at one end to the solder balls 6 and protruding at the other end from the side face 1*d* so as to be able to contact the heat generating part, not shown, of an external heating unit. For the method for manufacturing fixed probes 61, it is possible to use a method of pinching a copper plate material between the insulating substrates in the manufacture process of the substrate 1. The probes 61 are preferably formed by a material of better heat conductivity. Materials suitable for the fixed probes 61 are metals, such as copper, silver and platinum, copper alloys, such as Zr—Cu, Fe—Cu and Ni—Cu, or iron alloys, such as 42-alloy (42% Ni—Fe).

In the repair method and the mounting method of the semiconductor device according to the seventh embodiment, after a heat generator part, not shown, of a heating unit is heated, the heat generator part is brought into contact with the end portions 61*a* of the fixed probes 61 (or the heat generator is first brought into contact with the fixed probes and then heated), to thereby heat the solder balls 6. After this, by separating the heat generator part of the heating unit from the end portions 61*a* of the fixed probes (or by turning off the heating), the solder balls 6 are cooled down.

According to the seventh embodiment, the solder balls 6 can be heated uniformly. Because the fixed probes 61 can be heated from the side faces 1*d* of the substrate 1, the so-called three-dimensional mounting is made possible, by which the structure of the semiconductor device is expanded in the height direction. In the mounting process, flux, not shown, is applied to the solder balls 6 of the semiconductor device, the solder balls 6 are put on the terminals of the mother board 21, and then the fixed probes 61 are heated by the heat generating part of the heating unit.

In other respects except for what was described above, the seventh embodiment is the same as the first embodiment.

A filler of gel resin may be provided to fill up the gap between the through-hole 7 and the fixed probe 61 as shown in FIG. 23.

Figure 24:
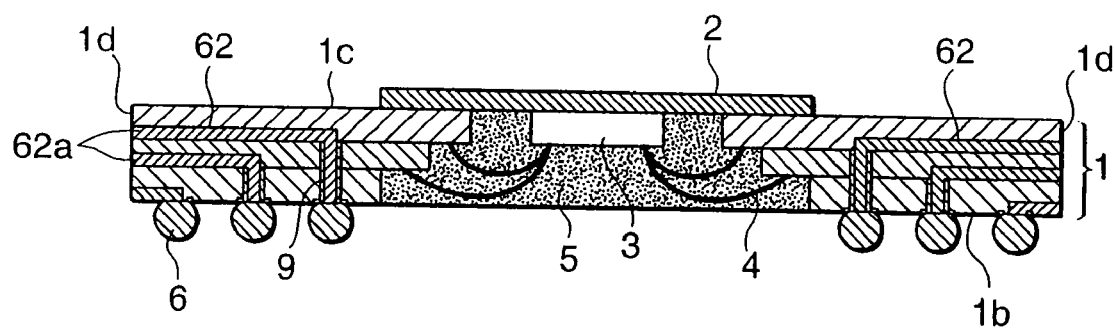
FIG. 24 is a sectional view schematically showing a modification of the seventh embodiment.

FIG. 24 is a sectional view schematically showing a modification of the semiconductor device according to the seventh embodiment of the present invention.

The semiconductor device as a modification shown in FIG. 24 differs from the semiconductor device as the seventh embodiment in FIG. 23 in that the end faces 62*a* of the fixed probes 62 are flush with the side faces 1*d* of the 10 substrate 1. In this modification, protrusions that can contact the end faces 62*a* of the fixed probes 62 need to be provided on the heat generator body of the heating unit.

Figure 25:
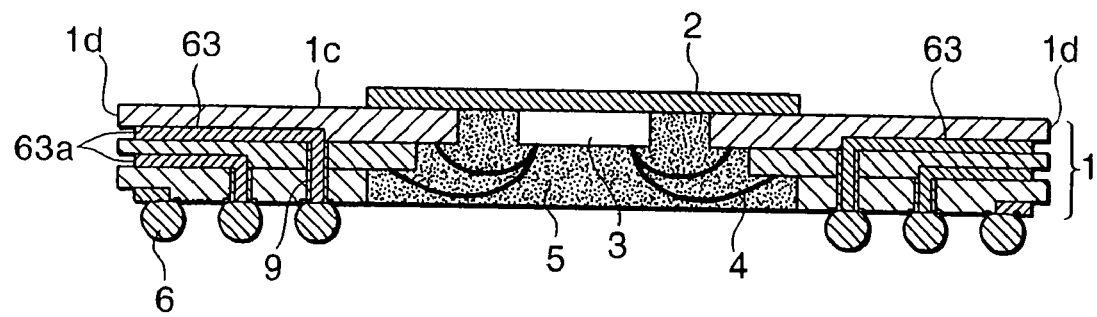
FIG. 25 is a sectional view schematically showing another embodiment of the present invention.
Figure 26:
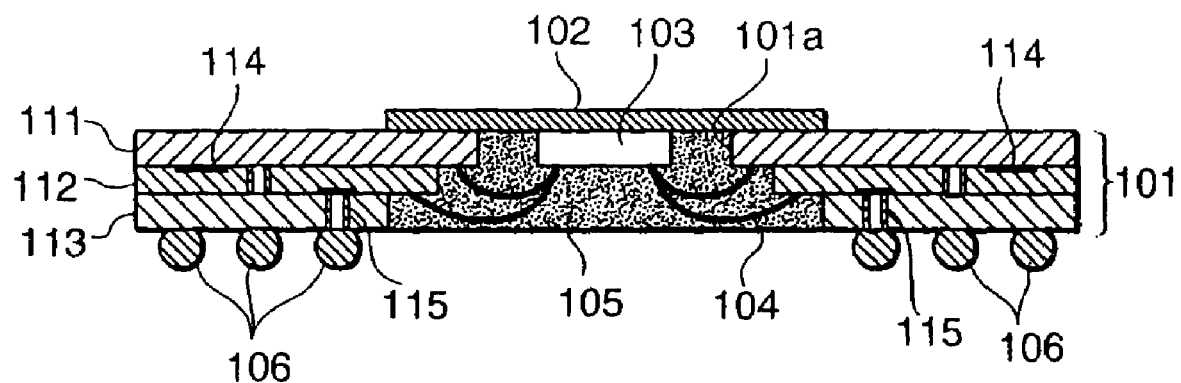
FIG. 26 is a sectional view schematically showing the structure of a conventional semiconductor device.
Figure 27:
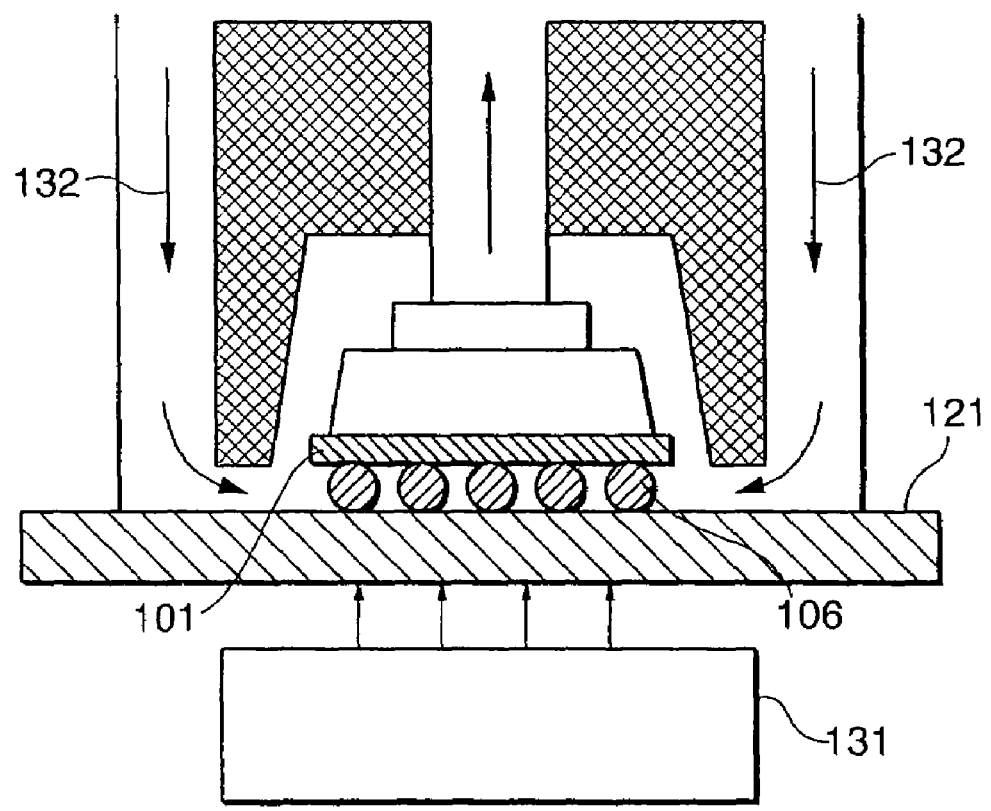
FIG. 27 is an explanatory diagram for illustrating a process for mounting a conventional semiconductor device.
Figure 28:
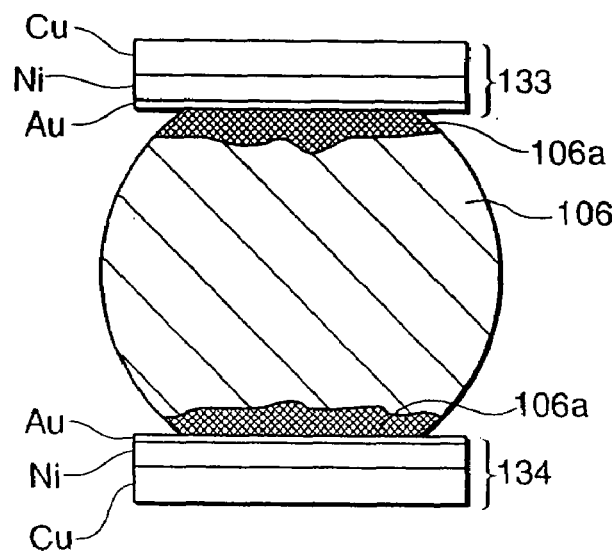
FIG. 28 is an explanatory diagram for explaining a problem of the conventional semiconductor device.
Figure 29A:
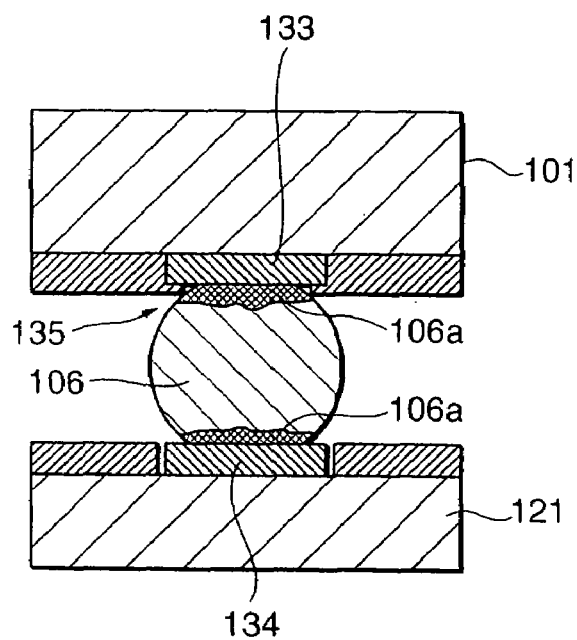
FIG. 29(a) is a sectional view showing a crack of the solder joint in the conventional semiconductor device.
Figure 29B:
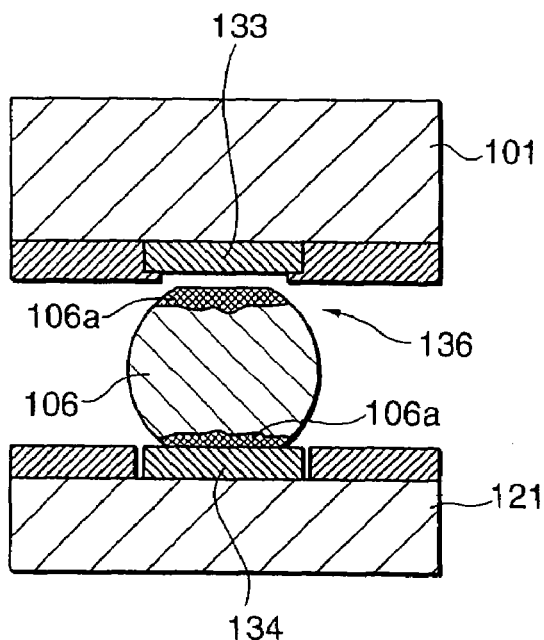
FIG. 29(b) is a sectional view showing a separation of the solder joint in the conventional semiconductor device.

FIG. 25 is a sectional view schematically showing another modification of the semiconductor device according to the seventh embodiment of the present invention.

The semiconductor device as a modification shown in FIG. 25 differs from the semiconductor device shown in FIG. 23 in that the end faces 63*a* of the fixed probes 63 are retracted from the side faces 1*d* of the substrate 1. In this modification, protrusions, which can contact the end faces of the fixed probes 63 need to be provided on the heat generating part of the heating unit.

According to the semiconductor device according to the present invention, the occurrence rate of failures attending on mounting of semiconductor devices can be reduced.

Further, according to the semiconductor device of the present invention, failures in the solder joints of semiconductor devices can be repaired easily, making it unnecessary to replace semiconductor devices having failures at their solder joints.

Further, if the through-holes of the semiconductor device according to the present invention are filled with fillers, it is possible to prevent deterioration of the solder joints resulting from penetration of foreign substances.

Further, if fixed probes as heat conductors are used to fill up the through-holes of the semiconductor device according to the present invention, the structure of the heating unit to heat the solder balls can be simplified.

Further, if the end portions of the fixed probes are exposed on the side faces of the substrate, three-dimensional mounting becomes possible by which semiconductor substrates are stacked one upon another.

According to the mounting method of the semiconductor device of the present invention, the occurrence rate of failures attending on mounting of semiconductor devices can be decreased.

According to the repair method of the semiconductor device of the present invention, the defective solder joints can be repaired easily and semiconductor devices having such failures need not be changed.

What is claimed is:

1. A method for mounting a semiconductor device on a printed circuit board, having a semiconductor chip, a substrate having a first wiring layer electrically connected to said semiconductor chip and also having a surface with a terminal, a solder ball connected to said terminal, a through-hole adjacent to said first wiring layer, said through-hole goes through said substrate and extends to said solder ball through said terminal, and a second wiring layer extending from said first wiring layer along an internal wall of said through-hole, said second wiring layer electrically connects between said first wiring layer and said terminal, said method comprising the steps of:

placing said semiconductor device on said printed circuit board through said solder ball;

inserting a hot heating probe into said through-hole from a surface of said substrate opposite to said surface with said terminal and thrusting said solder ball with said probe in order to melt said solder ball; and pulling said probe out from said solder ball in order to solidify said solder ball.

2. A method for repairing a semiconductor device placed on a printed circuit board and to be joined to said board with solder, said semiconductor device has a semiconductor chip, a substrate having a first wiring layer electrically connected to said semiconductor chip and also having a surface with a terminal, a solder ball connected to said terminal, a through-hole adjacent to said first wiring layer, said through-hole goes through said substrate and extends to said solder ball through said terminal, and a second wiring layer extending from said first wiring layer along an internal wall of said through-hole, said second wiring layer electrically connects between said first wiring layer and said terminal, comprising the steps of:

inserting a hot heating probe into the through-hole from a surface of said substrate opposite to said surface with said terminal and thrusting said solder ball with said probe in order to melt said solder ball; and pulling said probe out from said solder ball in order to solidify said solder ball.

3. The method recited in claim 1, wherein the hot heating probe is formed of a heat conductive material, one end of the probe contacting the solder ball and another end of the probe being adapted to come into contact with an external heat generating mechanism, whereby heat generated by the external heat generating mechanism is conducted by the probe and transferred to the solder ball to melt said solder ball.

4. The method recited in claim 1, wherein the substrate is a multilayer substrate formed by stacking a plurality of insulating substrates and the first wiring layer.

5. A semiconductor device according to claim 1, wherein the terminal has an opening that matches an opening of the through-hole in shape.

6. The method recited in claim 2, wherein the hot heating probe is formed of a heat conductive material, one end of the probe contacting the solder ball and another end of the probe being adapted to come into contact with an external heat generating mechanism, whereby heat generated by the external heat generating mechanism is conducted by the probe and transferred to the solder ball to melt said solder ball.

7. The method recited in claim 2, wherein the substrate is a multilayer substrate formed by stacking a plurality of insulating substrates and the first wiring layer.

8. A semiconductor device according to claim 2, wherein the terminal has an opening that matches an opening of the through-hole in shape.

9. A method of repairing or mounting a semiconductor device, comprising:

providing a semiconductor chip;

providing a substrate having a first wiring layer electrically connected to the semiconductor chip, and having a first surface with a terminal thereon, and a second surface that is opposite to the first surface;

disposing a solder ball on, and in alignment with, the terminal;

extending a through-hole through the substrate, and from the first surface to the second surface, the through-hole being adjacent to the first wiring layer, the through-hole being in alignment with the solder ball;

disposing a second wiring layer on an internal wall of the through-hole, and extending from the first wiring layer to the terminal to electrically connect the first wiring layer to the terminal; and inserting a probe, comprised of a heat conductive material, in the through-hole, one end of the probe touching the solder ball, and another end of the probe being disposed in a region of the second surface, the another end being uncovered to provide access to the probe.

10. The method recited in claim 9, further comprising disposing a heat slug on the second surface, and over the semiconductor chip.

11. The method recited in claim 9, wherein the another end of the probe is disposed out of the through-hole and above the second surface.

12. The method recited in claim 9, wherein the another end of the probe is disposed within the through-hole and below the second surface.

13. The method recited in claim 9, wherein the another end of the probe is disposed flush with the second surface.

14. The method recited in claim 9, wherein the terminal has an opening that is in alignment with the through-hole, the terminal opening having a shape that matches a cross-sectional shape of the through-hole.

15. The method recited in claim 9, wherein the solder ball covers the terminal opening.

16. The method recited in claim 9, wherein the probe is fixed in the through-hole.

* * * * *